US008653460B2

(12) United States Patent
Vardi et al.

(10) Patent No.: US 8,653,460 B2
(45) Date of Patent: Feb. 18, 2014

(54) METHOD AND SYSTEM FOR DETECTING LIGHT

(75) Inventors: Alon Vardi, Haifa (IL); Gad Bahir, Haifa (IL)

(73) Assignee: Technion Research & Development Foundation Limited, Haifa (IL)

(*) Notice: Subject to any disclaimer, the term of this patent is extended or adjusted under 35 U.S.C. 154(b) by 567 days.

(21) Appl. No.: 12/789,479

(22) Filed: May 28, 2010

(65) Prior Publication Data
US 2010/0301216 A1    Dec. 2, 2010

Related U.S. Application Data

(60) Provisional application No. 61/181,679, filed on May 28, 2009, provisional application No. 61/181,680, filed on May 28, 2009.

(51) Int. Cl.
*G01J 5/20*         (2006.01)
(52) U.S. Cl.
USPC ........................................................ 250/338.4
(58) Field of Classification Search
USPC ................................................ 250/336–339
See application file for complete search history.

(56) References Cited

U.S. PATENT DOCUMENTS

| | | | |
|---|---|---|---|
| 5,155,571 A | 10/1992 | Wang et al. | |
| 6,603,784 B1 | 8/2003 | Johnson | |
| 6,975,660 B2 | 12/2005 | Johnson | |
| 7,109,526 B2 | 9/2006 | Gentner et al. | |
| 7,256,417 B2 | 8/2007 | Mawst et al. | |
| 7,391,507 B2 | 6/2008 | Chism, II | |
| 7,457,338 B2 | 11/2008 | Mawst et al. | |
| 7,737,411 B2 | 6/2010 | Gunapala et al. | |
| 7,768,048 B2 | 8/2010 | Ueno et al. | |
| 8,003,434 B2 | 8/2011 | Maimon | |
| 8,154,008 B2 | 4/2012 | Lee et al. | |
| 2004/0259284 A1 | 12/2004 | Lin | |
| 2005/0017176 A1* | 1/2005 | Koch et al. | 250/338.4 |
| 2005/0056868 A1* | 3/2005 | Gentner et al. | 257/222 |
| 2005/0170542 A1 | 8/2005 | Matsumura | |
| 2005/0173694 A1 | 8/2005 | Mawst et al. | |
| 2007/0009001 A1 | 1/2007 | Shigihara et al. | |
| 2007/0215900 A1 | 9/2007 | Maimon | |
| 2007/0221908 A1 | 9/2007 | Takahashi et al. | |
| 2007/0228358 A1* | 10/2007 | Ofek | 257/21 |
| 2007/0248135 A1 | 10/2007 | Mawst et al. | |
| 2008/0112452 A1 | 5/2008 | Chakraborty et al. | |
| 2010/0072457 A1 | 3/2010 | Iguchi et al. | |
| 2010/0118905 A1 | 5/2010 | Yabushita et al. | |
| 2010/0295095 A1 | 11/2010 | Klipstein | |
| 2010/0308300 A1 | 12/2010 | Pan | |
| 2011/0204214 A1 | 8/2011 | Bahir et al. | |
| 2013/0075694 A1 | 3/2013 | Albo et al. | |

OTHER PUBLICATIONS

Notice of Allowance Dated Jun. 22, 2012 From the US Patent and Trademark Office Re. U.S. Appl. No. 12/789,481.

(Continued)

*Primary Examiner* — Michael G Lee
*Assistant Examiner* — Matthew Mikels

(57) ABSTRACT

A light detecting system is disclosed. The system comprises an arrangement of quantum dots forming an optically active region, a channel region and a charge carrier extractor between the active region and the channel region. The charge carrier extractor is characterized by a set of gradually decreasing energy levels between a characteristic excited energy level of the active region and a characteristic conductance energy level of the channel region.

23 Claims, 5 Drawing Sheets

(56) References Cited

OTHER PUBLICATIONS

Gendron et al. "Quantum Cascade Photodetector", Applied Physics Letters, 85(14): 2824-2826, Oct. 4, 2004.

Shields et al. "Detection of Single Photons Using a Field-Effect Transistor Gated by a Layer of Quantum Dots", Applied Physics Letters, 76(25): 3673-3675, Jun. 19, 2000.

Restriction Official Action Dated Feb. 22, 2012 From the US Patent and Trademark Office Re. U.S. Appl. No. 12/789,481.

Bedair "Atomic Layer Epitaxy Deposition Processes", Journal of Vacuum Science & Technology B, 12(1): 179-185, Jan./Feb. 1994.

"Self-Assembled GaInNAs/GaAsN Quantum Dot Lasers: Solid Source Molecular Beam Epitaxy Growth and High-Temperature Operation", Nanoscale Research Letters, 1: 20-31, 2006.

Yoon et al. "Self-Assembled GaInNAs/GaAsN Quantum Dot Lasers: Solid Source Molecular Beam Epitaxy Growth and High-Temperature Operation", Nanoscale Research Letters, 1: 20-31, 2006.

Notice of Allowance Dated Mar. 26, 2013 From the US Patent and Trademark Office Re. U.S. Appl. No. 13/031,293.

Office Action Dated Dec. 26, 2012 From the Israel Patent Office Re. Application No. 204083 and Its Translation Into English.

Notice of Allowance Dated Oct. 2, 2012 From the US Patent and Trademark Office Re. U.S. Appl. No. 13/031,302.

Bank et al. "Recent Progress on 1.55-?m Dilute-Nitride Lasers", IEEE Journal of Quantum Electronics, 43(9): 773-785, Sep. 2007.

Klipstein "'XBn' Barrier Photodetectors for High Sensitivity and High Operating Temperature Infrared Sensors", Proceedings of SPIE, the International Society of Optical Engineering, 34th Conference on Infrared Technology and Applications, Orlando, FL, USA, Mar. 17-20, 2008, 6940(2): 69402U.1-69402U.12, 2008.

Maimon et al. "NBn Detector, An Infrared Detector With Reduced Dark Current and Higher Operating Temperature", Applied Physics Letters, 89: 151109-1-151109-3, 2006.

Mawst et al. "MOCVD-Grown Dilute Nitride Type II Quantum Wells", IEEE Journal of Selected Topics in Quantum Electronics, 14(4): 979-991, Jul./Aug. 2008.

Peter et al. "Realization and Modeling of a Pseudomorphic (GaAsl-xSbx-InyGal-yAs)/GaAs Bilayer-Quantum Well", Applied Physics Letters, 67(18): 2639-2641, Oct. 30, 1995.

Notice of Allowance Dated Apr. 10, 2013 From the US Patent and Trademark Office Re. U.S. Appl. No. 13/656,852.

\* cited by examiner

METHOD AND SYSTEM FOR DETECTING LIGHT

RELATED APPLICATIONS

This application claims the benefit of priority from U.S. Provisional Patent Application No. 61/181,679 filed on May 28, 2009, and U.S. Provisional Patent Application No. 61/181,680 filed on May 28, 2009.

This application is being filed on the same day with a U.S. patent application entitled "STRAIN-CONTROLLED ATOMIC LAYER EPITAXY, QUANTUM WELLS AND SUPERLATTICES PREPARED THEREBY AND USES THEREOF" to Albo et al., Ser. No. 12/789,481.

The contents of all of the above documents are incorporated by reference as if fully set forth herein.

FIELD AND BACKGROUND OF THE INVENTION

The present invention, in some embodiments thereof, relates to photodetection and, more particularly, but not exclusively, to detection of long wavelength photons.

Recording and measuring a weak signal presents challenging and acute problems for the designers of modern sensors for myriad applications in diverse fields of science and technology. In these sensors, various primary signals (optical, ultrasonic, mechanical, chemical, radiation, etc.) are transformed into elementary charge carriers, such as electrons, holes or ions. Signal charge packets of such elementary charge carriers are amplified and converted to an electrical signal which is fed into a recording or analyzing device and/or used as a feedback signal for monitoring.

One approach to the detection of weak optical signals is the use of photodetectors in which the exposure times are long. These photodetectors typically employ semiconductor technology. Long exposure time photodetectors are suitable for static light source having constant intensity over time (e.g., stars), but are not suitable for rapid imaging applications in which the light has non constant emission intensity and/or originate from moving objects.

Another approach employs avalanche amplification (multiplication) of charge carriers. To date, avalanche amplification is recognized as a highly sensitive and high-speed method of amplification. Avalanche amplification is based on impact ionization arising in a strong electric field. The charge carriers accelerate in the electric field and ionize the atoms of the working medium of the amplifier, resulting in multiplication of the charge carriers. At a high multiplication factor, however, it is difficult to stabilize the avalanche amplification operating point. Additionally, the internal noise level and the response time grow rapidly with the multiplication factor.

Avalanche amplification based photodetectors are capable of converting a single photon to charge carriers and multiplying the charge. The number of photonic events is statistically estimated using the known quantum efficiency (QE) of the device. These photodetectors are suitable for static and well as dynamic light sources. Representative examples of such photodetectors include, high resolution arrays of photomultiplier tubes, avalanche photodiode array activated in the Geiger mode, electron multiplied CCDs, and intensified image sensors.

Avalanche photodiodes are the semiconductor analog to the photomultiplier tubes. By applying a high reverse bias voltage, an avalanche photo diode presents an internal current gain effect due to impact ionization. Unlike the photomultiplier tube, an array of the avalanche photodiode provides high resolution imaging with medium cost effectiveness. However, these devices suffer from high dark current and therefore require cooling to cryogenic temperatures for single photon imaging. The cooling requirement presents a major drawback to the technology because the cooling system significantly increases the power consumption, dimensions and cost of the device.

Since the energy of photon is inversely proportional to its wavelength the detection of long wavelength single photons, particularly in the infrared (IR) range, is more difficult.

IR detectors can be categorized according to the transport direction, the type of optical transitions, and the type of detection mechanism which can be photovoltaic or photoconductive. Broadly speaking, in response to light impinging on the detector, a photovoltaic detectors generates a measurable voltage (and current), while a photoconductive detector changes its conductance (or resistance).

Currently, prevalent infrared photodetection technology is based on interband (IB) absorption, wherein (IB) transitions occur in narrow bandgap semiconductors such as HeCdTe, InSb and InGaAs, mostly in PIN configuration. Another technology is based on intersubband (ISB) transitions in heterostructures in a configuration known as Quantum Well Infrared Photodetectors (QWIP), wherein the photodetection mechanism is via absorption between subbands rather than between the valence and conduction bands. An additional technology is based on type-II superlattice structures engineered by deposition of a stack of successive semiconductor layers. Superlattice detectors are also typically limited to cryogenic operation. Although much effort is invested in improving the performances of all types of IR detectors, none of the above technologies was proven to be sensitive enough for single photon detection.

Also known are devices called quantum dot field effect transistor (QDFET) in which Quantum Dots (QDs) are embedded in close proximity to a high mobility channel of a field effect transistor (FET) [A. J. Shields et al., APL 76, 3673 (2000)]. In this device, photoexcited carriers are trapped in the QDs and modify the channel conductance. It was shown that due to screening effect even a single photoexcited carrier can cause a measurable change in the channel conductance. This technology allows single photon detection at wavelengths of 900 nm and 340 nm for InAs and GaN QDs, respectively.

SUMMARY OF THE INVENTION

According to an aspect of some embodiments of the present invention there is provided a light detecting system. The system comprises: an arrangement of quantum dots forming an optically active region, a channel region and a charge carrier extractor between the active region and the channel region. In various exemplary embodiments of the invention the charge carrier extractor is characterized by a set of gradually decreasing energy levels between a characteristic excited energy level of the active region and a characteristic conductance energy level of the channel region.

According to some embodiments of the invention the system comprises a source electrode, a drain electrode and a gate electrode, wherein the channel region is connected between the source electrode and the drain electrode to allow flow of charge carrier between the source electrode and the drain electrode.

According to some embodiments of the invention the active region, the extractor and the channel region form a single light detecting unit, wherein the system comprises a plurality of such light detecting units. According to some embodiments of the invention the light detecting units are electrically connected in parallel.

According to some embodiments of the invention the highest energy level of the extractor is lower than the highest excited energy level of the active region. According to some embodiments of the invention the highest energy level of the extractor is lower than an intermediate excited energy level of the active region.

According to an aspect of some embodiments of the present invention there is provided a method of detecting light. The method comprises causing the light to impinge on an optically active region of a light detecting system such as the light detecting system described herein, and measuring the amount of change of electrical current generated by the system thereby detecting the light.

According to some embodiments of the invention the light is an infrared light.

According to some embodiments of the invention the light is a single photon.

According to some embodiments of the invention the light is polarized in a transverse magnetic (TM) polarization.

According to some embodiments of the invention the light is polarized in a transverse electric (TE) polarization.

According to an aspect of some embodiments of the present invention there is provided an imaging system. The imaging system comprises the light detecting system described herein.

According to an aspect of some embodiments of the present invention there is provided an optical communications system. The optical communications system comprises the light detecting system described herein.

According to an aspect of some embodiments of the present invention there is provided a quantum teleportation system. The quantum teleportation system comprises the light detecting system described herein.

According to an aspect of some embodiments of the present invention there is provided a quantum cryptography system. The quantum cryptography system comprises the light detecting system described herein.

According to an aspect of some embodiments of the present invention there is provided a quantum computer. The quantum computer comprises the light detecting system described herein.

According to an aspect of some embodiments of the present invention there is provided a system for analyzing a target material, which system comprises the light detecting system described herein.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

Figure 1A:
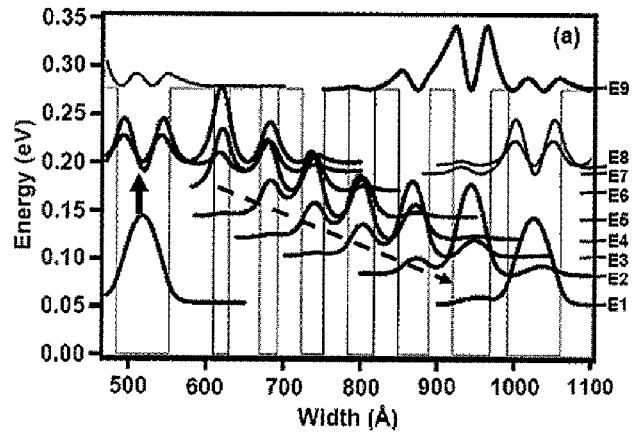
FIGS. 1A-C is a schematic illustration of the principles of a Quantum Cascade Detector (QCD)

The present invention, in some embodiments thereof, relates to photodetection and, more particularly, but not exclusively, to detection of long wavelength photons.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Figure 1B:
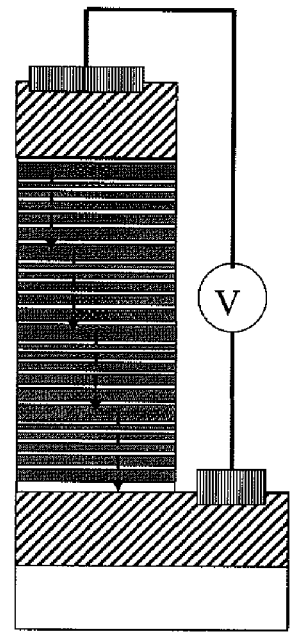
Figure 1C:
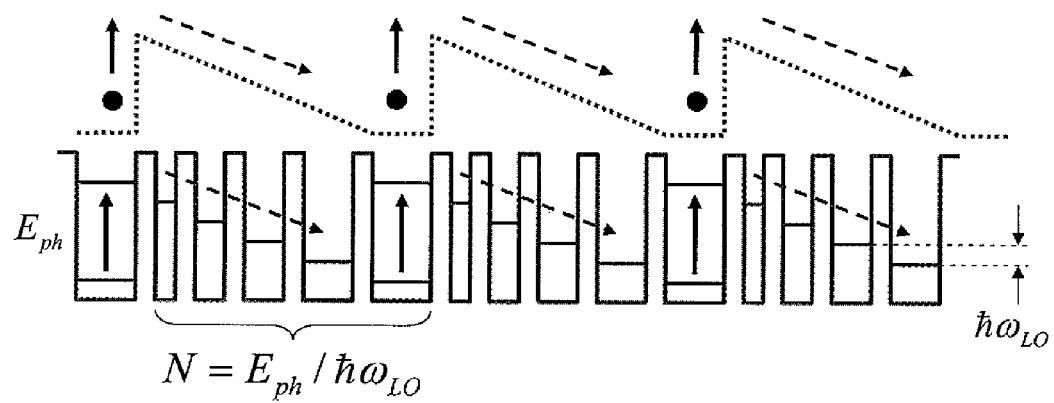

For purposes of better understanding some embodiments of the present invention, as illustrated in FIGS. 2A-9 of the drawings, reference is first made to the construction and operation of a Quantum Cascade Detector (QCD) as illustrated in FIGS. 1A-C. The QCD comprises a plurality of quantum wells (QW) and is a type of photovoltaic QWIP. The conduction band energy levels and wave functions of one period of the QCD at zero bias are presented in FIG. 1A, and a schematically illustration of the layers and substrates and contacts (patterned filling) of the QCD are presented in FIG. 1B. Blocks with solid filling represent layers, blocks with patterned filling represent substrates and contacts, dash arrows represent transport of electrons from one period to the next and solid arrow represents optical excitation in the active region of the QCD as also shown in FIG. 1C.

The active region is the widest QW, containing the ground state E1 and the highest excited state E8. The QCD period is design such that E8 is coupled to E7 and so on down to E2 which is coupled to E1 of the next period. Optically excited carriers are transferred along the cascade and produce a measurable voltage between the contacts. The energy levels in QCD effectively form a saw-tooth potential schematically illustrated in FIG. 1C for the conduction band part of the quantum wells.

The present inventors found that in a QWIP, particularly a QCD, the responsivity does not depend on the number of periods. Although in such systems more than one period is grown, such increases the detectivity and electrical bandwidth but not the responsivity. To explain the origin of QCD low responsivity, consider the three periods illustrated in FIG. 1C. In order to establish a flow of one electron in the external circuit, three photons have to be absorbed, one in each period. This means that two photons are wasted.

Figure 2:
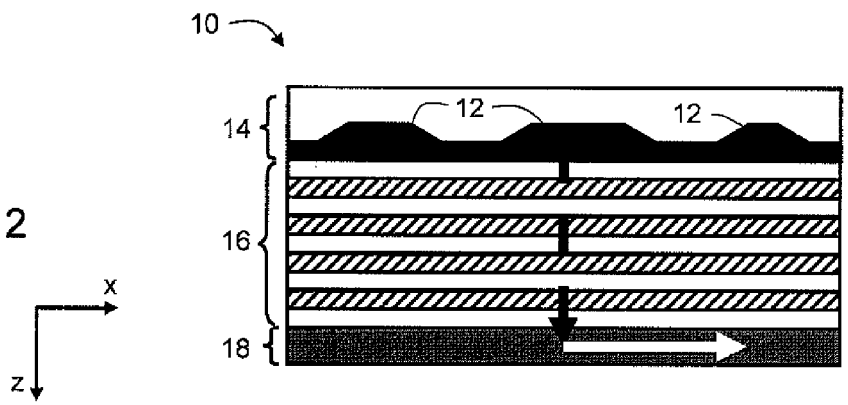
FIG. 2 is a schematic illustration of a light detecting system, according to various exemplary embodiments of the present invention.

FIG. 2 illustrates a light detecting system 10, according to various exemplary embodiments of the present invention. System 10 comprises an arrangement of quantum dots 12 forming an optically active region 14.

A quantum dot, as used herein, is a semiconductor crystalline structure with size dependent optical and electrical properties. Specifically, a quantum dot exhibits quantum confinement effects such that there is a three-dimensional confinement of electron-hole bound pairs or free electrons and holes. The semiconductor structure can have any shape. Preferably, the semiconductor structure the largest cross-sectional dimension of such structure is of less than about 15 nanometers, e.g., from about 0.2 nanometers to about 10 nanometers.

A quantum dot is structurally different from a quantum well. Unlike a quantum dot in which, as stated, there is a three-dimensional confinement, the electron-hole bound pairs or free carriers in a quantum well are confined only one-dimension and are generally free in the other two-dimensions.

When quantum dots 12 are irradiated by light from an excitation source (not shown) they reach respective energy excited states. As further detailed hereinunder, system 10 is preferably designed such that charge carriers that reach excited states are extracted from region 14 thereby converting the optical energy as manifested by the light to electrical energy as manifested by the motion of charge carriers.

In various exemplary embodiments of the invention the quantum dots include electrons in their conductance band. This can be achieved, for example, using self-assembled quantum dots in region 14.

Exemplary materials for use as quantum dots 12 according to some embodiments of the present invention include, but are not limited to group II-VI, III-V and group IV semiconductors such as GaN, ZnS, ZnSe, ZnTe, CdS, CdSe, CdTe, GaP, GaAs; GaSb, InP, InAs, InSb, AIS, AlP, AlSb, PbS, PbSe, Ge and Si, Ge and ternary and quaternary mixtures thereof, metals are also possible QDs structures, organic QDs.

The absorption spectrum of quantum dots 12 is characterized by one or more peaks that correspond to energy levels characterizing active region 14.

As used herein, "energy level" also encompasses a range of energies, also known in the literature as "energy band." Such range is typically characterized by an energy value and an energy width. For example, inhomogeneous dimension of the QDs results in broadening of the absorption and emission peaks hence also to wider energy bands. The terms "energy level" and "energy band" are used interchangeably throughout this document.

Figure 3:
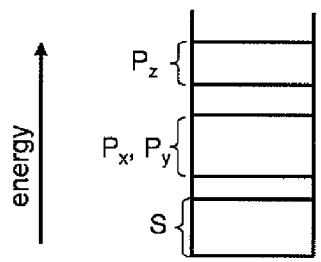
FIG. 3 shows a representative example of a set of energy levels characterizing active region, according to some embodiments of the present invention.
Figure 4:
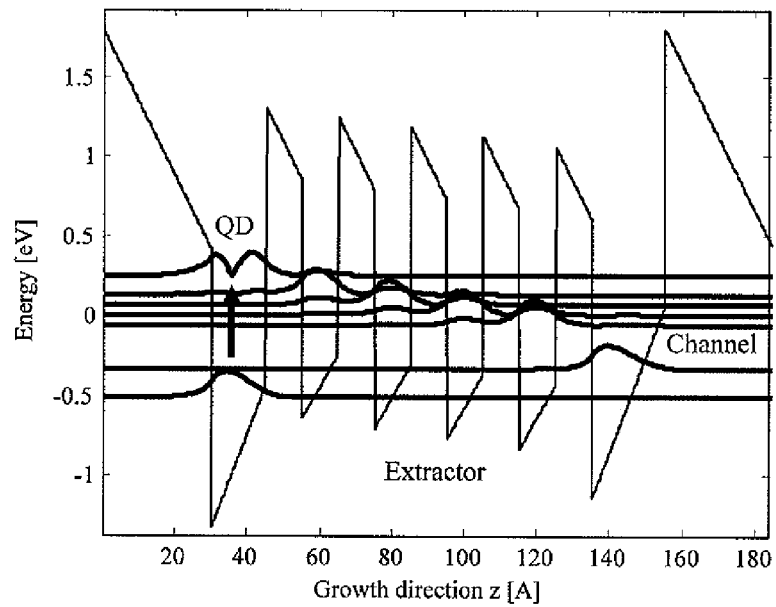
FIG. 4 is a schematic illustration showing a set of gradually decreasing energy levels characterizing a charge carrier extractor, according to some embodiments of the present invention.

FIG. 3 shows a representative example of a set of energy levels characterizing active region 14. FIG. 3 presents schemes of the conduction band part of the quantum dots. Shown in FIG. 3 is a three-level energy system, where each level is shown as a range of energies. The lowest energy level, also referred to as the ground state s, is typically, but not necessarily, the only occupied level. The energy level above the ground state corresponds to in-plane excitation of the quantum dot. In-plane excitation can be in two directions, conveniently denoted the x and y directions. In the present example, the quantum dots in region 14 are arranged such that in-plane excitations in the x and y directions occur at the same energy, denoted in FIG. 3 as the $p_x$, $p_y$ level. The $p_x$, $p_y$ level is the intermediate energy level in the three-level system of the present example. The highest energy level corresponds to excitation in the vertical or growth direction. The vertical or growth direction is conveniently denoted the z direction, and the energy level that correspond to excitation along the z direction is denoted $P_z$.

Generally, the wavelength selection of the quantum dots in active region 14 depends on the type of excitation, the shape and size of the quantum dots, and the sublevel transition in the conduction bands. The excitation of a quantum dot can be via interband transition (transition of charge carriers between a conductance band and a valence band) or via intraband transition (transition of charge carriers between energy levels that belong to the same energy band).

For example, in quantum dots made of GaN, intraband transition from the s state to the $p_z$ state corresponds to energy of about 0.8 eV (or, equivalently, wavelength of about 1.5 micron), intraband transition from the s state to the $p_x$ state corresponds to energy in the range of from about 0.2 eV to about 0.3 eV (wavelength of about 5 microns), and interband transition corresponds to energy of about 3.6 eV (wavelength of 0.345 nm).

It is appreciated that when quantum dot 12 reaches an excited state, it can experience a relaxation. For example, when the excitation is via interband transition the energy that is emitted by the quantum dot upon relaxation corresponds to the respective energy band gap. When the excitation is via intraband transition, the excited carriers can be relaxed in different ways, e.g., through the emission of longitudinal optical phonon. According to a preferred embodiment of the present invention, system 10 is designed such that the excited carriers are extracted from region 14 before the relaxation. This is preferably achieved by means of a charge carrier extractor, as further detailed hereinbelow with reference to FIGS. 2-5.

Referring again to FIG. 2, system 10 comprises a channel region 18 and a charge carrier extractor 16 between active region 14 and channel region 18. Channel region 18 is preferably constituted to form a two-dimensional electron gas therein. Extractor 16 serves for extracting excited charge carriers out of active region 14. Specifically, extractor 16 facilitates transport of charge carriers, via quantum tunneling, from active region 14 to channel region 18. Extractor 16 is characterized by a set of gradually decreasing energy levels between a characteristic excited energy level of active region 14 and a characteristic conductance energy level of channel region 18.

In various exemplary embodiments of the invention the energy levels of extractor 16 are selected such as to extract chare carriers excited via intraband transition. Nevertheless, while some embodiments are described with a particular emphasis to detection of light that induces intraband transitions, it is to be understood that more detailed reference to intraband transitions is not to be interpreted as limiting the scope of the invention in any way. Thus, in some embodiments of the present invention the energy levels of extractor 16 are selected such as to extract chare carriers excited via interband transition that excited electron-hole pair into the ground state of quantum dots 14. Extractor 16 can be constituted for extracting either electrons or holes. Specifically, the energy levels of extractor 16 can be between a characteristic excited energy level of electrons in active region 14 and a characteristic conductance energy level of electrons in channel region 18, or between a characteristic excited energy level of holes in active region 14 and a characteristic conductance energy level of holes in channel region 18.

Extractor 16 preferably has a layered structure wherein each layer of the structure corresponds to a different energy level of the set characterizing the extractor. A non-limited example of the energy levels of extractor 16 is illustrated schematically in FIG. 4, which presents conduction band parts. In the exemplified illustration of FIG. 4 active region 14 spans approximately from z=3 nm to z=4.5 nm, extractor 16 spans approximately from z=4.5 nm to z=13 nm and channel region 18 spans approximately from z=13 nm to 18 nm, other dimensions are not excluded for the scope of the present invention. The characteristic excited energy level of active region 14 is at about 0.3 eV, and the characteristic conductance energy level of cannel region 18 is about −0.4 eV. Extractor 16 has four energy levels gradually decreasing from about 0.25 eV near active region 14 to about −0.3 eV near channel 18. Thus, a charge carrier that is excited at region 14 is transferred along the extractor 16 until it reaches channel 18 where it is allowed flow substantially freely. From channel 18 the charge carrier can be collected via an electrode (not shown, see FIG. 5).

Generally, the materials from which extractor 16 and channel region 18 are made depend on the selected material for the quantum dots in the active region. Given the list of materials above for the quantum dots, the ordinarily skilled person would know how to selected appropriate material combination for system 10.

For example, in some embodiments the GaN\Al$_x$Ga$_{1-x}$N material combination is used. In these embodiments quantum dots 14 can comprise or be made of GaN, extractor 16 can comprise or be made of AlGaN/AlN and channel region 18 can comprise or be made of GaN. In other embodiments, quantum dots 14 can comprise or be made of InAs, extractor 16 can comprise or be made of GaInAs/GaAs, and channel 18 can comprise or be made of GaInAs. Such system can be grown on a GaAs substrate. In other embodiments, quantum dots 14 can comprise or be made of InAs or InGaAs, extractor 16 can comprise or be made of InP/InGaAs(P), and channel 18 can comprise or be made of InGaAs. Such system can be grown on a GaAs substrate. In other embodiments, quantum dots 14 can comprise or be made of In(Ga)AsN, extractor 16 can comprise or be made of AlGaAs/GaAs, and channel 18 can comprise or be made of GaAs or GaInAs. Such system can be grown on a GaAs substrate.

The energy levels of extractor 16 can be selected to allow the extraction of charge carriers at any of the excited levels of active region 14. In some embodiments, the highest energy level of extractor 16 is lower than the highest excited level (e.g., level $P_z$) but above the intermediate excited level (e.g., level $P_x, P_y$) of active region 14. These embodiments are useful for collecting only charge carriers that are excited to a level which is higher than the intermediate level. For example, these embodiments are useful when it is desired to detect light which is polarized in a transverse magnetic (TM) polarization.

In some embodiments of the present invention, the highest energy level of extractor 16 is lower than the intermediate level of region 14 (but above the ground state 5). These embodiments are useful for collecting charge carriers that are excited to the intermediate level. For example, these embodiments are useful when it is desired to detect light which is polarized in a transverse electric (TE) polarization. These embodiments are advantageous over traditional QWIP and QCD system which are only capable of detecting TE polarization since in these systems the in-plane excitations are undetectable.

Figure 5:
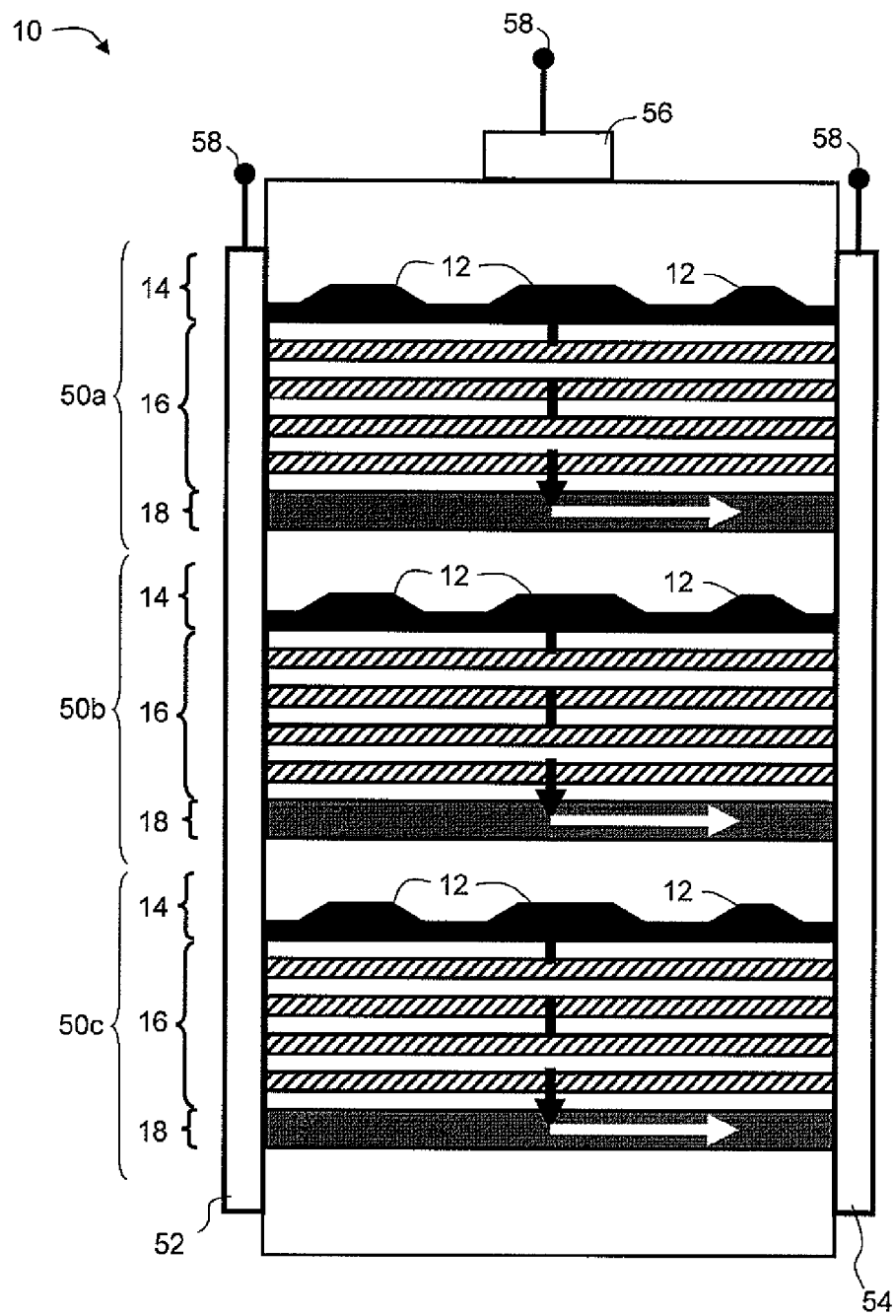
FIG. 5 is a schematic illustration of the light detecting system in embodiments in which the system includes several light detecting units.

FIG. 5 is a schematic illustration of system 10 in embodiments in which system 10 includes several light detecting units, generally shown at 50a, 50b and 50c. In these embodiments each detecting unit is formed of an active region (e.g., region 14), an extractor (e.g., extractor 16) and a channel region (e.g., region 18), as further detailed hereinabove. System 10 may also comprise a source electrode 52, a drain electrode 54 and a gate electrode 56. In these embodiments, the channel region of each detection unit is connected between source 52 and drain 54 to allow flow of charge carriers therebetween. Gate electrode 56 serves for applying a bias to system 10 so as to control the conductance between source 52 and drain 54. Gate electrode 56 can also serve for fine tuning of levels alignment, and for reset action, as further detailed hereinbelow. System 10 optionally includes also conductive contacts 58 for connecting electrodes 52, 54 and 56 to external circuit (not shown).

It is to be understood that although electrodes 52, 54 and 56 are illustrated in embodiments in which several light detecting units are employed, this need not necessarily be the case, since, for some applications, it may not be necessary for system 10 to have more than one light detecting unit. Thus, in some embodiments of the present invention system 10 includes a single light detecting unit (see e.g., FIG. 2) as well as a source electrode, a drain electrode and a gate electrode. For brevity of presentation, this optional embodiment is not illustrated, but the skilled person, provided with the details described herein would know how to adjust FIG. 2 to include also electrodes 52, 54 and 56.

When system 10 comprises several light detecting units, the units can have similar or different characteristics.

When the units have similar characteristics, the energy levels of the active region, extractor and channel region are respectively the same among the different units. These embodiments are useful for specific detection of light, wherein the light has a specific wavelength. Similar characteristics to all units can be ensured by using the same type of active region, same type of extractor and same type of channel region to all units.

When the units have different characteristics, at least some energy levels are different among the different units. These embodiments are useful for less specific or non-specific detection of light, wherein several different wavelengths are detectable. For example, in some embodiments of the present invention, two different units have active regions with the same characteristics and channel regions with the same characteristics but extractors with different characteristics. As a non-limiting and simplified example, consider a system in which in one unit the energy levels of the extractor are selected to extract charge carriers excited via s to $p_z$ transitions and in the another unit the energy levels of the extractor are selected to extract charge carriers excited via s to $p_x$ transitions. In this case, although the two units are similar in the characteristics of their active and channel regions, one unit detects photons at a wavelength corresponding to s to $p_z$ transitions and the other unit detects photons at a wavelength corresponding to s to $p_x$ transitions. Thus, in this example, the system is sensitive to two wavelengths.

The present inventors found that it is advantageous to include quantum dots in system 10 since it allows connecting the light detecting units in an electrically parallel configuration while maintaining a sufficiently large absorption volume. This is advantageous over traditional QWIP and QCD system in which such configuration is not possible, since the nature of QWs only allows use of top and bottom contacts (see FIG. 1B), wherein any existence of contacts in the plane of the QCD will result in electrical shorts via the QWs which allow free in-plane charge flow. Thus, in various exemplary embodiments of the invention light detecting units 50*a*, 50*b* and 50*c* are connected in an electrically parallel configuration.

While conceiving the present invention the present inventor discovered that in system 10 the optical excitation increases the amount of mobile charge in the channel. Specifically, it was found that absorption of a single photon increases the amount of mobile charge in the channel. The present inventors further discovered that optical excitation in active region 14 induces a sustainable positive charge ("quasi hole") in close proximity to channel 18. The quasi-hole life time is much longer than the rate of detection, and its affect on the channel conductance remains throughout its life time. An external signal can optionally be applied to the system (e.g., via the gate electrode) for removing the quasi-hole. Such external signal is referred to as a reset action.

The presence of quasi hole near channel 18 significantly improves the sensitivity of the system. This is because the quasi hole, although being induced by a single photon, affects the transport of thousands of electrons flowing in the channel due to the short distance between the quasi hole and the channel. Thus, effectively, system 10 operates as a field effect transistor (FET). More specifically, for a given constant potential difference between the gate electrode and the two dimensional electron gas in the channel, the change in the drain-source current caused by the addition of positive charge in the QD plane is amplified by the FETs trans-conductance. Over time, the charging of the QDs caused by even a single carrier results in the cumulative charge transfer in the channel, since a small change in the channel current is integrated over a relatively long period of time.

The system of the present embodiments can be configured for detecting light of any wavelength. This can be done by judicious selection of the energy levels of the active region, extractor and channel region of the system. In some embodiments of the present invention the system is configured for detecting light in the infrared range, e.g., the mid and/or far infrared range.

The system of the present embodiments is preferably characterized by high sensitivity. In some embodiments of the present invention the system is capable of detecting a single photon.

The system of the present embodiments is preferably characterized by high quantum efficiency. In particular, for a sufficiently large number of light detecting units (e.g., more than 10 units or more than 20 units or more than 30 units, say about 40 units or more), the quantum efficiency of the system can be more than 50% or more than 60%, say about 70% or more. Typically, the quantum efficiency per detecting unit of the system of the present embodiments is from about 1% to about 4%.

Figure 6:
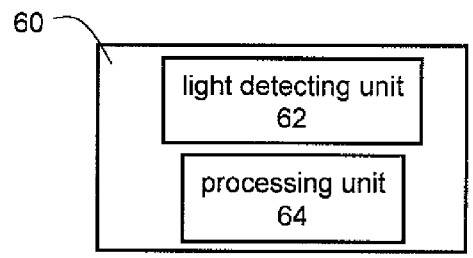
FIG. 6 is a schematic illustration of an imaging system, according to some embodiments of the present invention.

Reference is made to FIG. 6 which is a schematic illustration of an imaging system 60, according to some embodiments of the present invention. System 60 comprises a light detecting unit 62 which generates electrical current in response to light and a processing unit 64 which generates an image based on the generated current. Light detecting unit 62 can comprise one or more systems similar to system 10. For example, several such systems can be arranged pixelwise. Optionally, system 60 operates in the infrared domain so as to allow, e.g., thermal imaging.

Figure 7:
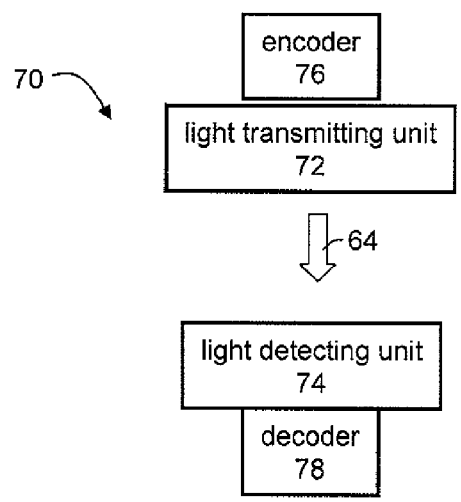
FIG. 7 is a schematic illustration of an optical communications system, according to some embodiments of the present invention.

FIG. 7 is a schematic illustration of an optical communications system 70, according to some embodiments of the present invention. Communications system 70 comprises a light transmitting unit 72 for transmitting light 74 and light detecting unit 76 which generates electrical current in response to light 74. Light detecting unit 62 can comprise one or more systems similar to system 10. Light transmitting unit 72 can be of any type known in the art. In some embodiments of the present invention light transmitting unit 72 comprises a superlattice structure, such as, but not limited to, the superlattice structure described in a U.S. patent application entitled "STRAIN-CONTROLLED ATOMIC LAYER EPITAXY, QUANTUM WELLS AND SUPERLATTICES PREPARED THEREBY AND USES THEREOF" to Albo et al. Ser. No. 12/789,481 which is co-filed with the present application and is owned in common with the present application.

System 70 preferably also comprises an encoder 76 coupled to unit 72 and configured for encoding information into light 74 prior to the transmission, and a decoder 78 which receives electrical current from unit 74, decodes it and outputs the information to an external appliance (not shown). Optionally, system 70 operates in the infrared domain. System 70 can be used in more than one way. In some embodiments of the present invention system 70 is employed as a quantum teleportation system wherein quantum information ("qubits") is transferred from unit 72 to unit 74. In some embodiments of the present invention system 70 is employed for quantum cryptography wherein encoder 76 and decoder 78 are configured to encrypt and decrypt the information encoded into light 74.

Figure 8:
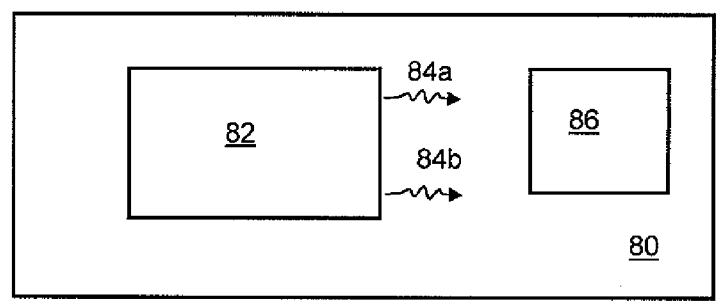
FIG. 8 is a schematic illustration of a quantum computer system according to some exemplary embodiments of the present invention.

In an aspect of some embodiments of the present invention system 10 is used as a component in a quantum computer. Quantum computing generally involves initializing the states of several entangled qubits, allowing these states to evolve, and reading out the states of the qubits after the evolution. FIG. 8 is a schematic illustration of a quantum computer system 80 according to some exemplary embodiments of the present invention. System 80 comprises an emission device 82 which emits two, preferably, entangled photons 84*a* and 84*b*, as known in the art. System 80 further comprises a calculation unit 86 which detects the photons, uses them as entangled qubits and performs calculations as known in the art. Calculation unit 86 can comprise one or more systems similar to system 10. Emission device 82 can be of any type known in the art. In some embodiments of the present invention emission device 82 comprises a superlattice structure, such as, but not limited to, the superlattice structure described in a U.S. patent application entitled "STRAIN-CONTROLLED ATOMIC LAYER EPITAXY, QUANTUM WELLS AND SUPERLATTICES PREPARED THEREBY AND USES THEREOF" to Albo et al. Ser. No. 12/789,481 which is co-filed with the present application and is owned in common with the present application.

In an aspect of some embodiments of the present invention system 10 is used for microscopy and or spectroscopy. In these embodiments photons are emitted in the direction of a sample to induce an optical effect in the sample.

Figure 9:
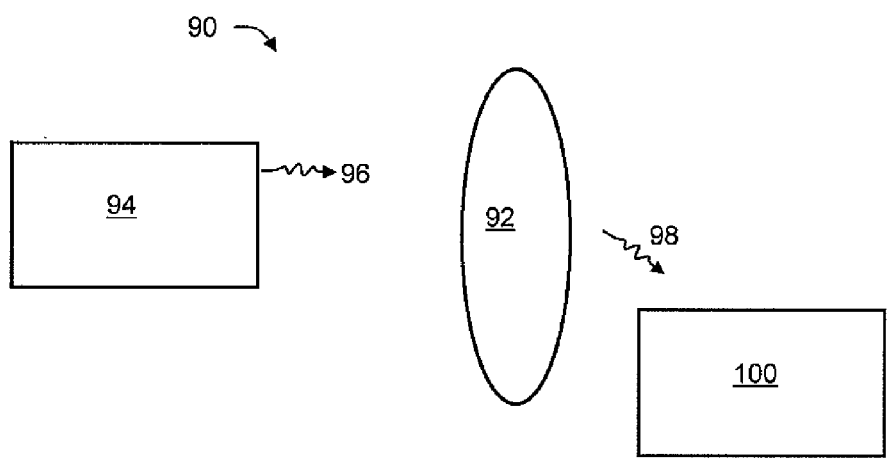
FIG. 9 is a schematic illustration of a system for analyzing a target material, according to some embodiments of the present invention.

FIG. 9 is a schematic illustration of a system 90 for analyzing a target material 92, according to some embodiments of the present invention. System 90 can be used for spectroscopy, microscopy and/or imaging of target material 92. For example, when target material 92 contains a fluorophore therein, system 90 can be used for fluorescence spectroscopy. System 90 comprises a light emitting unit 94 which emits one or more photons 96 in the direction of material 92. Light emitting unit 94 can be of any type known in the art. In some embodiments of the present invention light emitting unit 94 comprises a superlattice structure, such as, but not limited to, the superlattice structure described in a U.S. patent application entitled "STRAIN-CONTROLLED ATOMIC LAYER EPITAXY, QUANTUM WELLS AND SUPERLATTICES PREPARED THEREBY AND USES THEREOF" to Albo et al. Ser. No. 12/789,481 which is co-filed with the present application and is owned in common with the present application.

The emitted photons can be absorbed, transmitted or reflected by the material. When the photons can be absorbed, the material can emit in response radiation 98 which can be detected by a light detecting unit 100. When the photons are transmitted or reflected unit 100 detects the transmitted or reflected radiation. Unit 100 can comprise one or more systems similar to system 10. Unit 100 generates an electrical current responsively to radiation 98, which current is can be analyzed to determine, for example, the composition of the target material.

As used herein the term "about" refers to ±10%.

The word "exemplary" is used herein to mean "serving as an example, instance or illustration." Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments." Any particular embodiment of the invention may include a plurality of "optional" features unless such features conflict.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A light detecting system, comprising:
   an arrangement of quantum dots forming an optically active region, a channel region and a charge carrier extractor between said active region and said channel region,
   wherein said charge carrier extractor is characterized by a set of gradually decreasing energy levels between a characteristic excited energy level of said active region and a characteristic conductance energy level of said channel region, wherein said charge carrier extractor comprises a layered structure, and wherein each layer of said layered structure corresponds to a different energy level of said set.

2. The system according to claim 1, further comprising a source electrode, a drain electrode and a gate electrode, wherein said channel region is connected between said source electrode and said drain electrode to allow flow of charge carrier between said source electrode and said drain electrode.

3. The system according to claim 1, wherein said active region, said extractor and said channel region form a single light detecting unit, and wherein the system comprises a plurality of such light detecting units.

4. The system according to claim 3, wherein said plurality of light detecting units are electrically connected in parallel.

5. The system according to claim 1, wherein a highest energy level of said set of energy levels is lower than a highest excited energy level of said active region.

6. The system according to claim 1, wherein a highest energy level of said set of energy levels is lower than an intermediate excited energy level of said active region.

7. The system according to claim 1, wherein said characteristic excited energy level correspond to intraband transition in said active region.

8. An imaging system, comprising the light detecting system according to claim 1.

9. An optical communications system, comprising the light detecting system according to claim 1.

10. A quantum teleportation system comprising the light detecting system according to claim 1.

11. A quantum cryptography system comprising the light detecting system according to claim 1.

12. A quantum computer comprising the light detecting system according to claim 1.

13. A system for analyzing a target material comprising the light detecting system according to claim 1.

14. A method of detecting light, comprising causing the light to impinge on an optically active region of a light detecting system, and measuring a change of electrical current generated by said system thereby detecting the light;
    wherein said light detecting system comprises an arrangement of quantum dots forming an optically active region, a channel region and a charge carrier extractor between said active region and said channel region, and
    wherein said charge carrier extractor is characterized by a set of gradually decreasing energy levels between a characteristic excited energy level of said active region and a characteristic conductance energy level of said channel region, wherein said charge carrier extractor comprises a layered structure, and wherein each layer of said layered structure corresponds to a different energy level of said set.

15. The method according to claim 14, wherein the light is an infrared light.

16. The method according to claim 14, wherein the light is a single photon.

17. The method according to claim 14, wherein the light is polarized in a transverse magnetic (TM) polarization.

18. The method according to claim 14, wherein the light is polarized in a transverse electric (TE) polarization.

19. The method according to claim 14, wherein said active region, said extractor and said channel region form a single light detecting unit, and wherein the light detecting system comprises a plurality of such light detecting units.

20. The method according to claim 14, wherein said plurality of light detecting units are electrically connected in parallel.

21. The system according to claim 1, wherein said channel region is constituted to form a two-dimensional electron gas therein.

22. The system according to claim 1, wherein said charge carrier extractor is configured for extracting excited carriers from said active region to said channel via quantum tunneling while said quantum dots are excited and before said quantum dots experience a relaxation.

23. The system according to claim 1, wherein said layered structure is devoid of quantum dots.

* * * * *